United States Patent [19]
Smith

[11] Patent Number: 6,021,048
[45] Date of Patent: Feb. 1, 2000

[54] HIGH SPEED MEMORY MODULE

[76] Inventor: Gary W. Smith, 12376 Darkwood Rd., San Diego, Calif. 92129

[21] Appl. No.: 09/024,715

[22] Filed: Feb. 17, 1998

[51] Int. Cl.$^7$ ........................................................ H05K 7/10
[52] U.S. Cl. .......................... 361/736; 361/760; 361/765; 361/803; 361/764; 361/720; 361/785; 361/749; 257/723; 257/712; 257/686; 439/61
[58] Field of Search .................................... 361/736, 760, 361/765, 784, 779, 803, 764, 720, 785, 749; 257/723, 712, 686, 787; 439/624, 638, 67, 61

[56] References Cited

U.S. PATENT DOCUMENTS

| | | | |
|---|---|---|---|
| 5,224,023 | 6/1993 | Smith et al. | 361/784 |
| 5,446,317 | 8/1995 | Sato et al. | 257/734 |
| 5,513,135 | 4/1996 | Dell et al. | 365/52 |
| 5,646,446 | 7/1997 | Nicewarner, Jr. et al. | 257/723 |
| 5,661,339 | 8/1997 | Clayton | 257/678 |
| 5,708,297 | 1/1998 | Clayton | 257/723 |

*Primary Examiner*—Leo P. Picard
*Assistant Examiner*—David Foster
*Attorney, Agent, or Firm*—John J. Murphey

[57] ABSTRACT

A high-speed memory module defined by first and second elements the first element including a plurality of flexible, interior layers laminated together to form a substrate having opposed exterior surfaces, the substrate having a network of conductive traces and vias forming data paths therein, at least two substantially quadrangular, rigid circuit boards, each of the boards laminarly split into substantially symmetric half-sections, each of the half-sections having solder lands formed on a first face for mounting electronic components thereto and conductive traces and vias incorporated therein forming a continuation of the data paths, each of the half-sections having an opposite second face for bonding to the exterior surfaces of the substrate, the half-sections laminated together on either side of a portion of the substrate with the substrate being sandwiched therebetween, wherein any gap between two parallel spaced-apart edges of any two adjacent boards is wide enough to allow mounting of the boards in a parallel, face-to-face, layered arrangement by folding the substrate at the gap, the gap being wide enough to allow for an air space between any opposite facing component attached to separate boards, and the second element including, a rigid circuit board having a network of conductive traces and vias incorporated therein the board defined by spaced-apart first and second elongated edges, a comb of connecting terminals integral with the second element along the first elongated edge, the comb connected to the traces and vias to continue the data paths, the comb sized and dimensioned to engage a connecting port on a supporting structure, and a first plurality of feed-through holes engaging the data paths in the first element arranged for connection to a like second plurality of feed-through holes engaging the data paths formed in the second element, and device for interconnecting the first and the second feed-through holes so that the data paths from each of the half-sections through to the support structure are of substantially equal lengths.

24 Claims, 4 Drawing Sheets

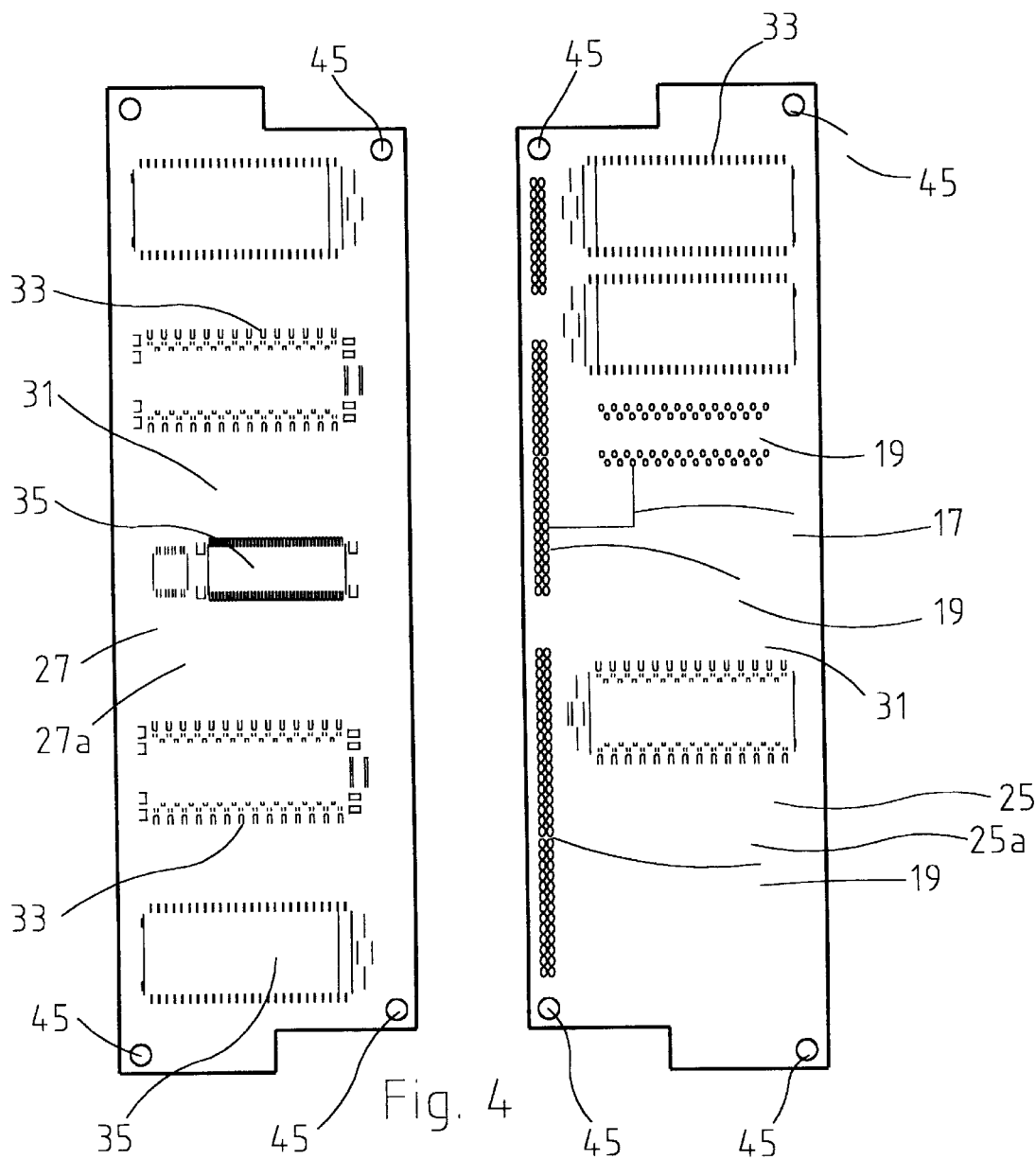
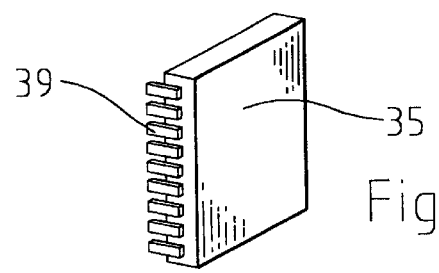

HIGH SPEED MEMORY MODULE

BACKGROUND OF THE INVENTION

1. Field of the Invention

This invention relates to the art of electronic circuit packaging, and more specifically to the packaging of electronic integrated circuits into assemblies referred to as "memory modules" for large capacity or high density memory applications in high speed computer systems.

2. Description of the Prior Art

Computers over time have increased in functionality and decreased in size. Driving this has been the miniaturization of circuitry and the maximum utilization of space through clever and innovative packaging techniques. Additionally, computer systems have become faster and, as a result, the need for higher speed packaging solutions has become necessary. In computers there are two types of memory, read-only memory (ROM) and random access memory (RAM). RAM is used as a temporary work space for software applications to store data that is currently being worked on, such as documents, pictures and the like. Because of the evolution of more complex software applications, a requirement for larger and larger amounts of RAM has developed.

Computers are designed to accommodate the need for expansion of RAM by employing a packaging technique known as a memory module. Memory modules come in various configurations and types and are commonly known as SIMMs (Single Inline Memory Module), DIMMs (Dual Inline Memory Module), SODIMMs (Small Outline Dual Inline Memory Module), PCMCIA (Personal Computer Memory Card International Association), and MMC (Micro Memory Cards), to name a few. Memory modules are separate electronic assemblies comprised of a plurality of memory integrated circuits and support circuitry such as line drivers or buffers, clock drivers or interface logic that is mounted on a printed circuit board. The printed circuit board has a plurality of connecting pads along one edge so that these assemblies can be installed in the computer by plugging them into connectors or sockets. A number of sockets are placed on computer motherboards so that the computer user may easily add or upgrade their RAM.

The prior art has developed foldable electronic module assembly specifically to take advantage of the assembly on which to mount extra memory components and to minimize the space consumed by the assembly. An example of this technique is found in U.S. Pat. No. 5,224,023, the '023 patent, wherein a pair of quadrangular circuit boards are each laminarly split and mounted on both sides of a flexible insulating substrate having a network of conductive leads and connecting stations applied thereto. The half-sections of boards are adapted to have memory chips mounted thereon and sandwich the substrate therebetween. A pair of spaced-apart folds is made in the substrate so that it takes on an "S" shape that is squeezed together to save space. One of the outside half-sections of circuit boards has a comb of connecting terminals formed along one free edge that is plugged into a socket on the motherboard.

While this foldable electronic module assembly saves room inside the computer enclosure and allows the addition of RAM and other components to the already crowded interior of the computer system, it does not solve additional problems brought on by the demands of high performance, high speed computer systems. In the foldable module of the '023 patent, the memory components on each successive section are located greater and greater distances from the interconnect point with the motherboard. As the speed of the memory data bus is increased in computer systems, in order to increase the performance of the system, the successive increase in travel distance caused by the physical arrangement of the memory components of the '023 patent induces a propagation delay that mitigates or diminishes the signal integrity of the memory system. It is necessary in high performance memory systems to make the trace lengths as short as possible and as equal in length as possible. The invention described below solves the trace length problems found in memory modules of the type in the '023 patent or other types in the industry that are described as board-stacking memory modules.

SUMMARY OF THE INVENTION

This invention is a folded electronic assembly module that provides near equal lengths of data and control traces for two or more separate sections of memory arrays. It is a high speed memory module assembly and solves the problem of varying and therefor unbalanced trace lengths caused by different lengths of traces between successive areas of memory on a folded module assembly. The invention also provides for the shortest trace lengths possible from the memory arrays to the interconnect edge that engages the socket on a folded module assembly.

This invention is a high speed memory module defined by a first and a second element. The first element comprises a rigid-flex, multi-layer printed circuit substrate that is foldable. This first element substrate has a network of printed and etched conductive circuit layers, traces and plated-through holes or vias that form at least two substantially quadrangular rigid sections separated by a gap of flexible circuit material that physically and electrically connects one rigid section to the other. Each quadrangular rigid section has opposing first and second faces onto which a network of conductive mounting pads for attaching a plurality of memory components is applied thereto. The rigid sections are electrically connected to each other across the gap by conductive traces etched into the flexible substrate. The substrate is folded along the axis of the gap and the gap is of sufficient width such that the rigid sections can be configured in a parallel, face-to-face arrangement. The gap is also of sufficient width to allow for an air space between any opposite facing component attached to separate rigid sections. Adjacent to the gap, and along one of the edges of either rigid section that is parallel and closest to the gap are a number of connecting stations or through-holes that engage the second element.

The second element comprises a rigid quadrangular substrate having spaced-apart first and second elongated edges. The first edge contains a comb of connecting terminals dimensioned to engage a connecting port such as a connector or socket designed for memory modules. The second edge contains a like set of connecting stations or through-holes that mate or engage the connecting stations of the first element along its gap. The first element is assembled to the second element through interconnecting of the like sets of matching connection stations by means such as wire, pins or solder bumps thereby forming a high-speed module assembly where the trace lengths from each rigid memory section to the connecting port and the supporting structure, such as a motherboard, are of the shortest length possible.

Accordingly, the main object of this invention is a means of reducing the propagation delay from high density folded memory modules to the computer processor. Other objects of this invention include a means of increasing the memory capacity of memory modules; a means of providing a high-speed, high density memory module; a means of providing a packaging technique for assembling expandable memory modules in a compact arrangement which does not require substantial space allocation for future expansion; a packaging technique for assembling memory modules to allow the fabrication of memory modules of different capacities in the same compact package configuration such as SIMM, DIMM, SODIMM or the like; a means of permitting efficient upgrading of existing computers utilizing space-saving technology without deterioration of signal integrity between the expanded memory and the computer processor.

These and other objects of the invention will become more clear upon reading the Description of the Preferred Embodiments taken together with the drawings appended hereto. The scope of protection sought by the inventor may be gleaned from a fair reading of the claims that conclude this specification.

DESCRIPTION OF THE DRAWINGS

FIG. 4 is a plan view of one of two rigid circuit boards that are laminarly split to form half-sections and made a part of the first element of this invention;

FIG. 5 is a perspective view of a typical memory chip that is mounted on the module of this invention;

DESCRIPTION OF THE PREFERRED EMBODIMENTS

Figure 2:
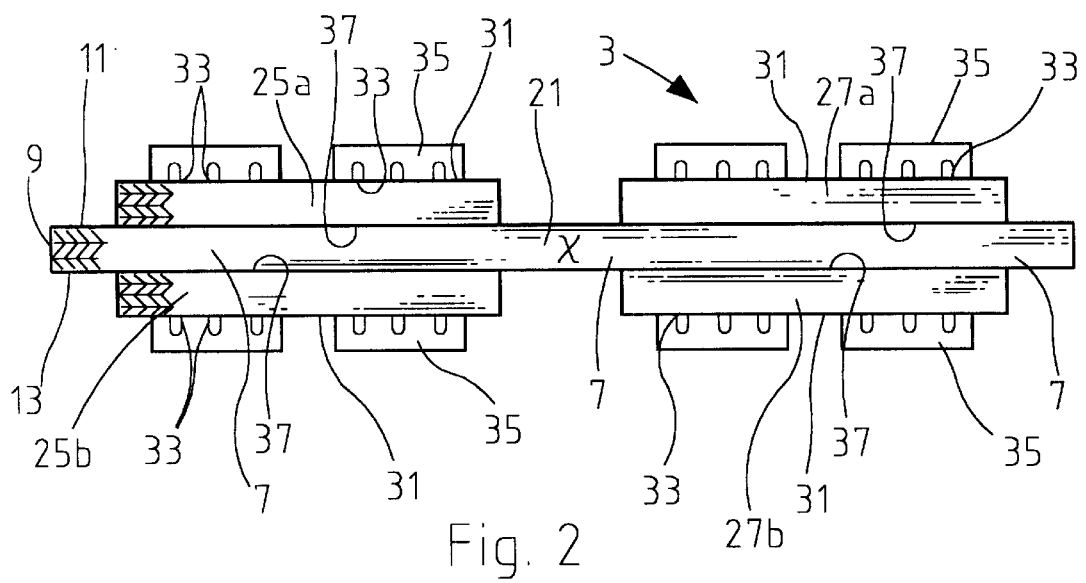
FIG. 2 is a close-up side view of the module showing the individual layers of the first and second elements.
Figure 1:
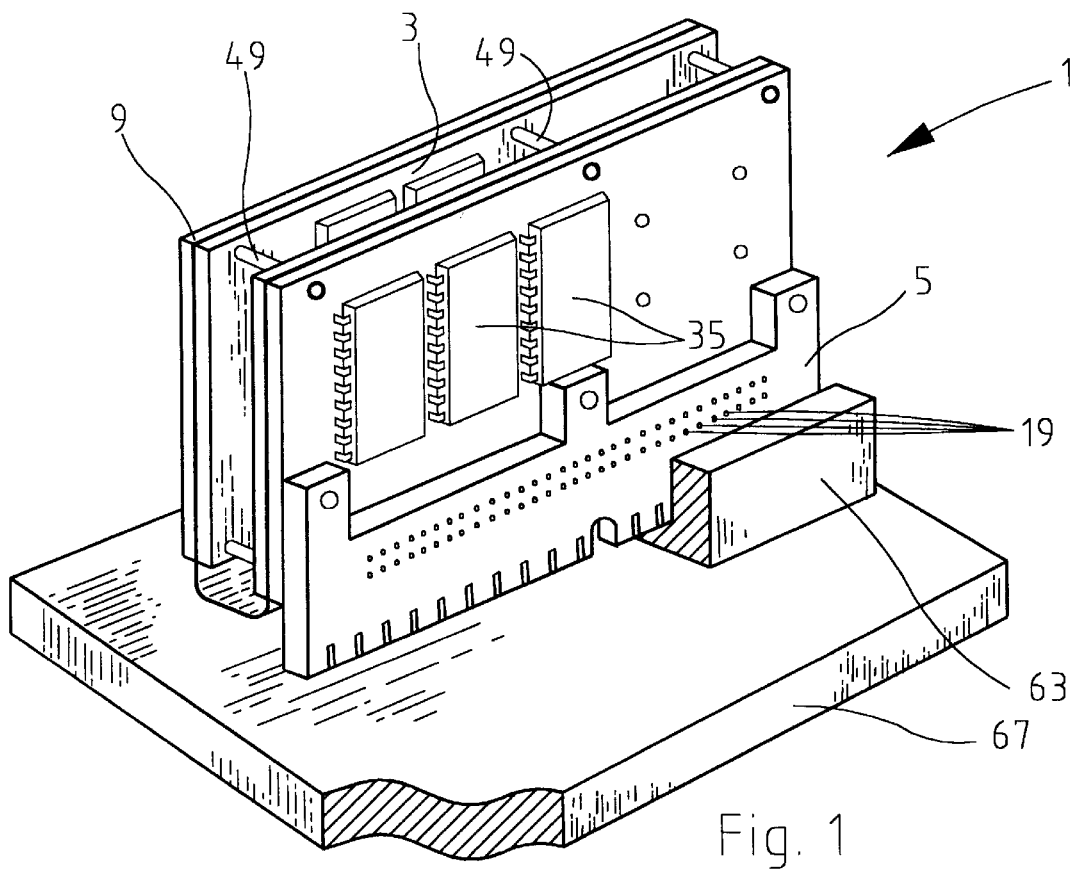
FIG. 1 is an isometric view of the preferred embodiment of this invention.
Figure 6:
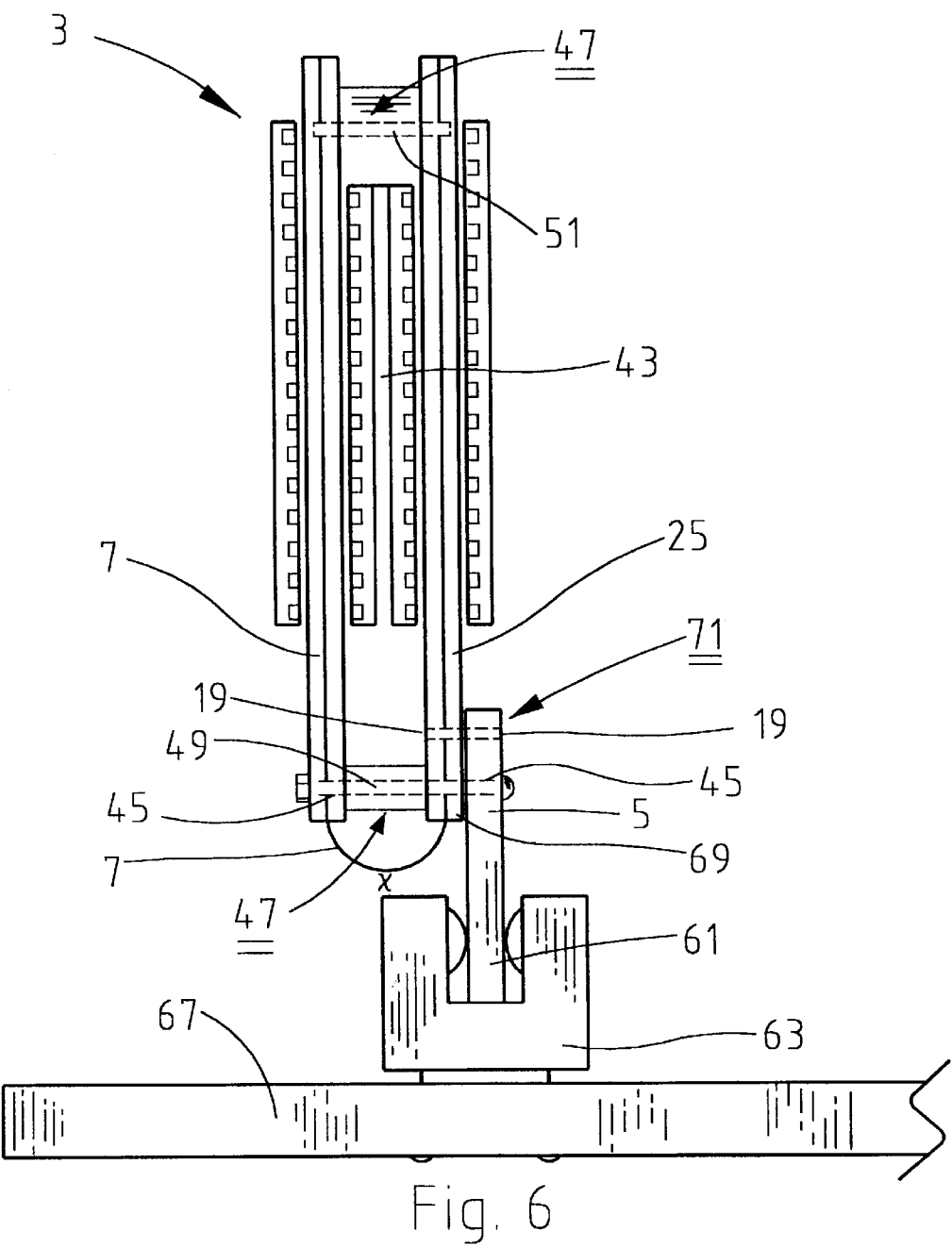
FIG. 6 is an end view of the preferred embodiment of this invention shown in FIG. 1.

Turning now to the drawings, where elements are identified by numerals, and like elements are identified by like numerals throughout the 9 figures, the preferred embodiment of the invention 1 is shown in FIGS. 1, 2 and 6 to comprise first and second elements 3 and 5 respectively. First element 3 is a rigid-flexible device shown in FIG. 2 to comprise a plurality of flat, flexible, insulating interior layers of resinous material laminated together to form a substrate 7, as is commonly found in the computer industry. Substrate 7 is defined by an outer perimeter 9 and opposed, exterior surfaces 11 and 13. Substrate 7 has formed in said layers a network of conductive traces or leads 17 and plated feedthrough holes or vias 19 forming conductive data paths therein. The thickness of substrate 7 and the number of layers and their individual functions is determined by application and design.

Substrate 7 contains a horizontal axis X—X about which it is folded, preferably into a U-shaped assembly as shown in FIGS. 1 and 6. The area about the fold is known as a flexible appendage or "gap" 21. Contained within gap 21 and along axis X—X in locations appropriate to the specific module requirements and determined by application are vent holes 23 that permit air flow up from the bottom of the module assembly to carry off heat produced in the operation of the computer and by the components mounted on the module.

One of two substantially quadrangular, multi-layered, rigid circuit boards is shown in FIG. 4 laminarly split into same size but half-thick (still multi-layer) first and second half-sections 25 and 27. Because there are two circuit boards used in this invention, there will be two first half-sections 25a and 25b as well as two second half-sections 27a and 27b; one of each is shown in FIG. 4. Each first half-section 25a and 25b and each second half-section 27a and 27b has a first face 31 on which a plurality of solder pads 33 are formed, as shown in FIG. 2, for mounting electronic components, such as memory chips 35 of the type shown in FIG. 5.

Each first half-section 25a and 25b and each second half-section 27a and 27b also has a second face 37 located on the opposite side thereof from first face 31 adapted for bonded lamination against exposed exterior substrate surfaces 11 and 13 preferably in an arrangement where said first and second half-sections 25 and 27 sandwich substrate 7 therebetween. It is also preferred that half-sections 25 and 27 are laminated in a side-by-side, parallel, spaced-apart configuration as shown in FIGS. 1, 2 and 6.

In the lamination of half-sections 25 and 27 with substrate 7, the leads 39 (see FIG. 5) of memory chips 35 or other components are placed in electrical contact with solder pads 33 on first faces 31 of half-sections 25a, 25b, 27a and 27b on either or both sides of substrate 7 and the electrical connections are carried by traces 17, interior of first element 3, that act as continued data paths to other chips and/or to one or more connections terminating in holes or vias 19 formed element 3.

Gap 21 is set by specification of the particular application of the invention. Primarily, it is set wide enough to allow mounting of both half-sections of both boards on opposite sides of substrate 7 and preferably to allow mounting of said half-sections in a parallel, face-to-face, layered arrangement when folding substrate 7 along axis X—X as shown in FIGS. 1 and 6. Further, consideration is given to setting the width of gap 21 at a distance that will allow an air space 43 to exist between any opposite facing memory chip or component 35 attached to separate board half-sections when the module is folded into a U-shape as shown in FIG. 6. In the use of extended or upgraded memory, to which this inventive memory module is directed, the use of extra or additional memory results in more electrical power being consumed with an attendant rise in heat developed in the components. Air space 43 is desired to provide a path for currents of air to pass and carry much of this extra heat away from the chips and other components so that they will perform their respective tasks at ambient temperatures for which they are designed.

A plurality of apertures 45 are shown in FIG. 6 formed in substrate 7 and in split half-sections 25a, 25b, 27a and 27b for aligned arrangement for receipt therethrough of fastening means 47 to hold first element 3 in the desired U-shape configuration. A wide variety of fastening means 47 are available in the industry for this purpose, such as spacers and standoffs 49, of metal and plastic, and nut/bolt combinations 51 and the like.

Figure 7:
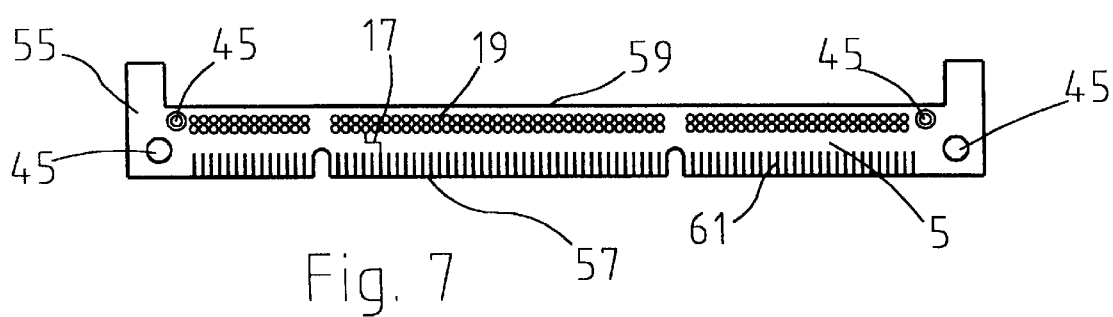
FIG. 7 is a plan view of the second element of this invention.

FIG. 7 shows second element 5 to comprise a multi-layered rigid circuit board 55 having more conductive traces 17 and holes or vias 19 incorporated therein as continued data paths. Board 55 is defined by spaced-apart first and second elongated edges 57 and 59 respectively, preferably formed parallel to each other. A comb 61 of connecting terminals or edge-connector lands are located along first edge 57 and preferably are made integral with board 55. Comb 61 and its terminals are sized and dimensioned to engage a connecting port 63 mounted on an underlying supporting structure 67, such as a motherboard, as shown in FIGS. 1 and 6. The thickness of second element 5 is determined by application and the requirements of connecting port 63.

A first plurality of feed-through holes or vias 19, extending the data paths, are formed in first element 3, preferably along one edge 69 that becomes a lower edge in the U-shape configuration, as shown in FIG. 6, to align with and for connection through means 71 to a like second plurality of feed-through holes or vias 19 in second element 5 that continue the data paths all the way to comb 61. In addition, a plurality of larger holes 45 are formed in that part of split half-section 25 that engages second element 5 and in second element 5 itself for receipt therethrough of fastening means 47 of the type described earlier herein, to mount element 3 and element 5 together in fixed arrangement as shown in FIG. 6.

Figure 8B:
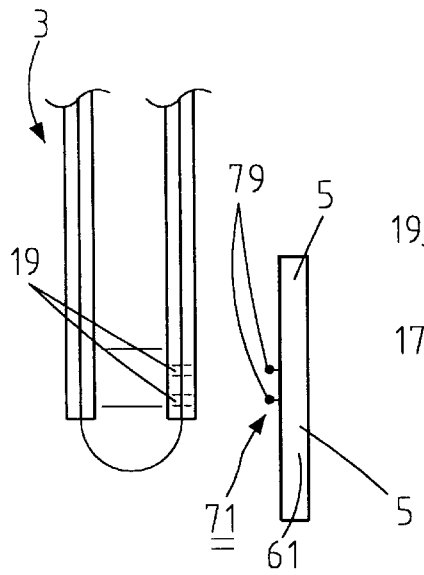
FIGS. 8a and 8b are two different types of means of electrically connecting the data paths of the first and the second elements making up the module of this invention.
Figure 8A:
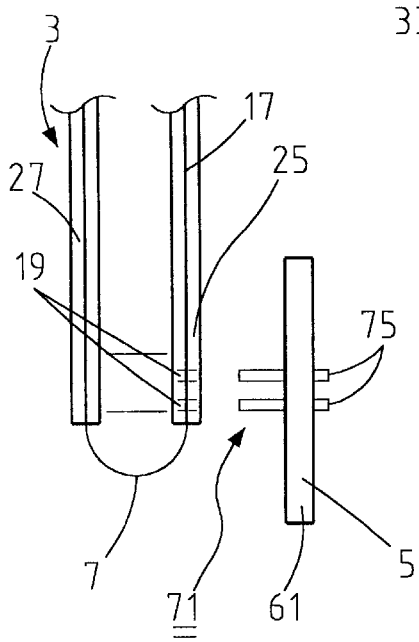
Figure 3:
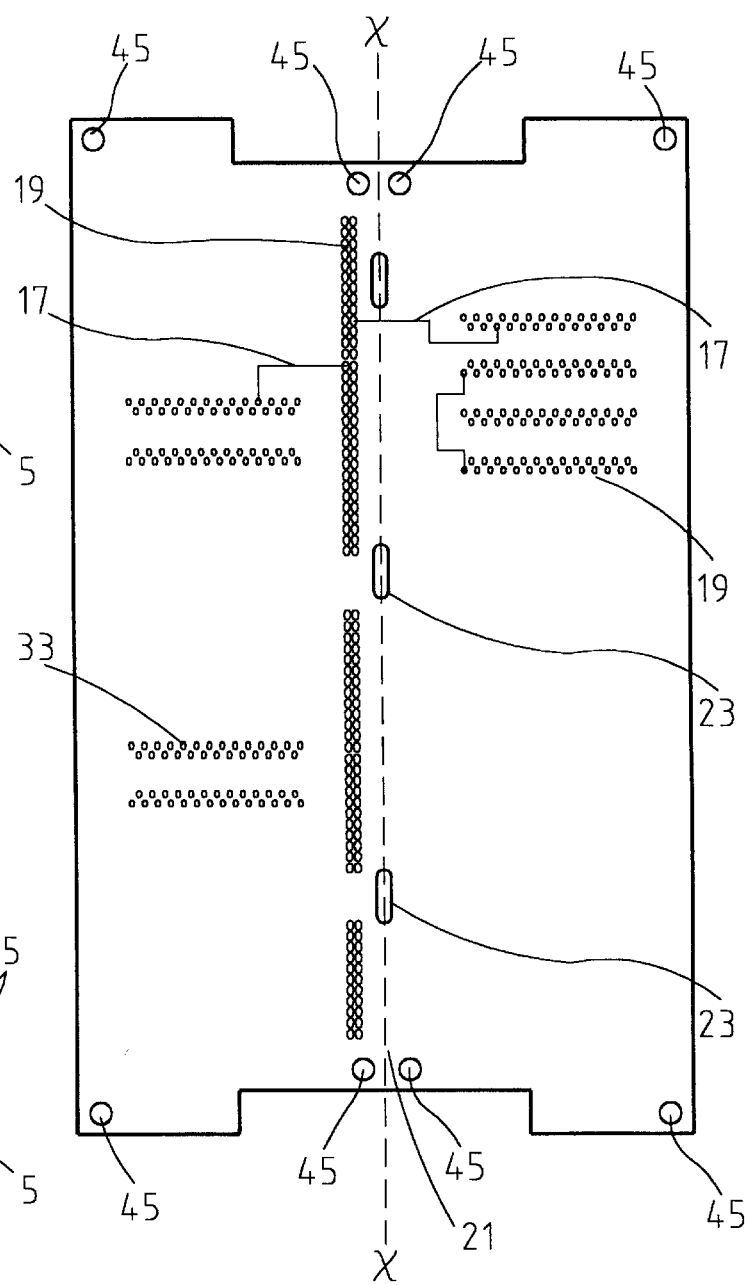
FIG. 3 is a plan view of a typical substrate that forms the inner layer of the first element of this invention.

FIGS. 8a and 8b show two examples of means 71 for making an electrical connection between a first plurality of feed-through holes 19 formed in first element 3 and an aligned second-plurality of feed-through holes 19 formed in second element 5. In FIG. 8a metal pins 75 are passed through the aligned holes and fixed therein as by soldering or like process. In FIG. 8b solder "bumps" 79 are formed on both sets of aligned holes and heated to make the solder from each "bump" flow therebetween.

This design is an important aspect of the invention because the construction produces data paths, from each of said half-sections 25a, 25b, 27a and 27b, from the memory chips and other components mounted thereon, through substrate 7 and second element 5 into comb 61, of substantially equal lengths. This design evens out the length of travel of data from chips 35 to motherboard 67.

While the invention has been described with reference to a particular embodiment thereof, those skilled in the art will be able to make various modifications to the described embodiment of the invention without departing from the true spirit and scope thereof. It is intended that all combinations of elements and steps which perform substantially the same function in substantially the way to achieve substantially the same result are within the scope of this invention.

What is claimed is:

1. A high-speed memory module defined by first and second elements:
   a) said first element comprising:
      i) a plurality of flexible, interior layers laminated together to form a substrate having opposed exterior surfaces, said substrate having a network of conductive traces and vias forming data paths therein;
      ii) at least two substantially quadrangular, rigid circuit boards, each of said boards laminarly split into substantially symmetric half-sections;
      iii) each of said half-sections having solder lands formed on a first face for mounting electronic components thereto and conductive traces and vias incorporated therein forming a continuation of said data paths;
      iv) each of said half-sections having an opposite second face for bonding to said exterior surfaces of said substrate;
      v) said half-sections laminated together on either side of a portion of said substrate with said substrate being sandwiched therebetween;
      vi) wherein any gap between two parallel spaced-apart edges of any two adjacent boards is wide enough to allow mounting of said boards in a parallel, face-to-face, layered arrangement by folding said substrate at said gap;
      vii) said gap being wide enough to allow for an air space between any opposite facing component attached to separate boards;
   b) said second element comprising:
      i) a rigid circuit board having a network of conductive traces and vias incorporated therein said board defined by spaced-apart first and second elongated edges;
      ii) a comb of connecting terminals integral with said second element along said first elongated edge, said comb connected to said traces and vias to continue said data paths;
      iii) said comb sized and dimensioned to engage a connecting port on a supporting structure; and,
      iv) a first plurality of feed-through holes engaging said data paths in said first element arranged for connection to a like second plurality of feed-through holes engaging said data paths formed in said second element; and,
   c) means for interconnecting said first and said second feed-through holes so that said data paths from each of said half-sections through to said support structure are of substantially equal lengths.

2. The high-speed memory module of claim 1 wherein said rigid circuit boards in said first element are multi-layered.

3. The high-speed memory module of claim 1 wherein said rigid circuit boards in said second element are multi-layered.

4. The high-speed memory module of claim 1 wherein said half-sections are laminated in a side-by-side, parallel spaced-apart configuration.

5. The high-speed memory module of claim 1 where said half-sections are laminated directly across from each other.

6. The high-speed memory module of claim 1 wherein a plurality of apertures are formed through said substrate and said circuit boards for receipt therethrough of fasteners to hold said boards in spaced-apart arrangement.

7. The high-speed memory module of claim 1 wherein said means for interconnecting said first and said second feed-through holes includes wires soldered through said holes.

8. The high-speed memory module of claim 1 wherein said assembly is folded into a U-shape.

9. A plurality of the assembly of claim 1 in combination with a socket electrically attached to an underlying support structure.

10. The high-speed memory module of claim 1 wherein said comb is the only electronic connection point between said high-speed memory module and said underlying support structure.

11. The high-speed memory module of claim 1 wherein said comb is the only mechanical connection between said high-speed memory module and said underlying support structure.

12. The high-speed memory module of claim 1 wherein said connecting port comprises a Single In Line Memory Module (SIMM) style port.

13. The high-speed memory module of claim 1 wherein said connecting port comprises a Dual Inline Memory Module (DIMM) style port.

14. The high-speed memory module of claim 1 wherein said connecting port comprises a Small Outline Dual Inline Memory Module (SODIMM) style port.

15. The high-speed memory module of claim 1 wherein said connecting port comprises a Personal Computer Memory Card International Association (PCMCIA) style port.

16. The high-speed memory module of claim 1 wherein said connecting port comprises a Micro Memory Card (MMC) style port.

17. The high-speed memory module of claim 1 wherein said solder pads are sized, dimensioned and positioned to electronically engage memory integrated circuit modules.

18. The high-speed memory module of claim 1 further including a plurality of holes formed in said substrate for air to pass therethrough and providing cooling to electronic components mounted on said module.

19. The high-speed memory module of claim 1 wherein at least some of said holes are located in said gap.

20. A high-speed memory module defined by first and second elements:
 a) said first element comprising:
  i) a plurality of flexible, interior layers laminated together to form a substrate having opposed exterior surfaces, said substrate having a network of conductive traces and vias forming data paths therein;
  ii) at least two quadrangular, multi-layered, rigid circuit boards, each of said boards laminarly split into symmetric half-sections;
  iii) each of said half-sections having solder lands formed on a first face for mounting electronic components thereto and conductive traces and vias incorporated therein forming a continuation of said data paths;
  iv) each of said half-sections having an opposite second face for bonding to said exterior surfaces of said substrate;
  v) said half-sections laminated together on either side of a portion of said substrate with said substrate being sandwiched therebetween;
  vi) said half-sections laminated in a sise-by-side, parallel spaced-apart configuration;
  vii) wherein any gap between two parallel spaced-apart edges of any two adjacent boards is wide enough to allow mounting of said boards in a parallel, face-to-face, layered arrangement by folding said substrate at said gap;
  viii) said gap being wide enough to allow for an air space between any opposite facing component attached to separate boards; and,
 b) said second element comprising:
  i) a multi-layered rigid circuit board having a network of conductive traces and vias incorporated therein said board defined by spaced-apart first and second elongated edges;
  ii) a comb of connecting terminals integral with said second element along said first elongated edge, said comb connected to said traces and vias to continue said data paths;
  iii) said comb sized and dimensioned to engage a connecting port on a supporting structure; and,
  iv) a first plurality of feed-through holes engaging said data paths in said first element arranged for connection to a like second plurality of feed-through holes engaging said data paths formed in said second element; and,
 c) means for interconnecting said first and said second feed-through holes so that said data paths from each of said half-sections through to said support structure are of equal lengths;
 d) wherein said assembly is folded into a U-shape about an axis passing horizontally through said substrate.

21. A high-speed memory module defined by first and second elements:
 a) said first element comprising:
  i) a plurality of flexible, interior layers laminated together to form a substrate having opposed exterior surfaces, said substrate having a network of conductive traces and vias forming data paths therein;
  ii) at least two quadrangular, rigid circuit boards, each of said boards laminarly split into symmetric half-sections;
  iii) each of said half-sections having solder lands formed on a first face for mounting electronic components thereto and conductive traces and vias incorporated therein forming a continuation of said data paths;
  iv) each of said half-sections having an opposite second face for bonding to said exterior surfaces of said substrate;
  v) said half-sections laminated together on either side of a portion of said substrate with said substrate being sandwiched therebetween;
  vi) wherein any gap between two parallel spaced-apart edges of any two adjacent boards is wide enough to allow mounting of said boards in a parallel, face-to-face, layered arrangement by folding said substrate at said gap;
  vii) said gap being wide enough to allow for an air space between any opposite facing component attached to separate boards;
 b) said second element comprising:
  i) a rigid circuit board having a network of conductive traces and vias incorporated therein said board defined by spaced-apart first and second elongated edges;
  ii) a comb of connecting terminals integral with said second element along said first elongated edge, said comb connected to said traces and vias to continue said data paths;
  iii) said comb sized and dimensioned to engage a connecting port on a supporting structure; and,
  iv) a first plurality of feed-through holes engaging said data paths in said first element arranged for connection to a like second plurality of feed-through holes engaging said data paths formed in said second element; and,
 c) means for interconnecting said first and said second feed-through holes so that said data paths from each of said half-sections through to said support structure are of equal lengths, wherein said fasteners are metal.

22. A high-speed memory module defined by first and second elements:
 a) said first element comprising:
  i) a plurality of flexible, interior layers laminated together to form a substrate having opposed exterior surfaces, said substrate having a network of conductive traces and vias forming data paths therein;
  ii) at least two quadrangular, rigid circuit boards, each of said boards laminarly split into symmetric half-sections;
  iii) each of said half-sections having solder lands formed on a first face for mounting electronic components thereto and conductive traces and vias incorporated therein forming a continuation of said data paths;
  iv) each of said half-sections having an opposite second face for bonding to said exterior surfaces of said substrate;

v) said half-sections laminated together on either side of a portion of said substrate with said substrate being sandwiched therebetween;

vi) wherein any gap between two parallel spaced-apart edges of any two adjacent boards is wide enough to allow mounting of said boards in a parallel, face-to-face, layered arrangement by folding said substrate at said gap;

vii) said gap being wide enough to allow for an air space between any opposite facing component attached to separate boards;

b) said second element comprising:

i) a rigid circuit board having a network of conductive traces and vias incorporated therein said board defined by spaced-apart first and second elongated edges;

ii) a comb of connecting terminals integral with said second element along said first elongated edge, said comb connected to said traces and vias to continue said data paths;

iii) said comb sized and dimensioned to engage a connecting port on a supporting structure; and, iv) a first plurality of feed-through holes engaging said data paths in said first element arranged for connection to a like second plurality of feed-through holes engaging said data paths formed in said second element; and, c) means for interconnecting said first and said second feed-through holes so that said data paths from each of said half-sections through to said support structure are of equal lengths, wherein said standoffs are plastic.

23. A high-speed memory module defined by first and second elements:

a) said first element comprising:

i) a plurality of flexible, interior layers laminated together to form a substrate having opposed exterior surfaces, said substrate having a network of conductive traces and vias forming data paths therein;

ii) at least two quadrangular, rigid circuit boards, each of said boards laminarly split into symmetric half-sections;

iii) each of said half-sections having solder lands formed on a first face for mounting electronic components thereto and conductive traces and vias incorporated therein forming a continuation of said data paths;

iv) each of said half-sections having an opposite second face for bonding to said exterior surfaces of said substrate;

v) said half-sections laminated together on either side of a portion of said substrate with said substrate being sandwiched therebetween;

vi) wherein any gap between two parallel spaced-apart edges of any two adjacent boards is wide enough to allow mounting of said boards in a parallel, face-to-face, layered arrangement by folding said substrate at said gap;

vii) said gap being wide enough to allow for an air space between any opposite facing component attached to separate boards;

b) said second element comprising:

i) a rigid circuit board having a network of conductive traces and vias incorporated therein said board defined by spaced-apart first and second elongated edges;

ii) a comb of connecting terminals integral with said second element along said first elongated edge, said comb connected to said traces and vias to continue said data paths;

iii) said comb sized and dimensioned to engage a connecting port on a supporting structure; and, iv) a first plurality of feed-through holes engaging said data paths in said first element arranged for connection to a like second plurality of feed-through holes engaging said data paths formed in said second element; and, c) means for interconnecting said first and said second feed-through holes so that said data paths from each of said half-sections through to said support structure are of equal lengths, wherein said standoffs include spacers.

24. A high-speed memory module defined by first and second elements:

a) said first element comprising:

i) a plurality of flexible, interior layers laminated together to form a substrate having opposed exterior surfaces, said substrate having a network of conductive traces and vias forming data paths therein;

ii) at least two quadrangular, rigid circuit boards, each of said boards laminarly split into symmetric half-sections;

iii) each of said half-sections having solder lands formed on a first face for mounting electronic components thereto and conductive traces and vias incorporated therein forming a continuation of said data paths;

iv) each of said half-sections having an opposite second face for bonding to said exterior surfaces of said substrate;

v) said half-sections laminated together on either side of a portion of said substrate with said substrate being sandwiched therebetween;

vi) wherein any gap between two parallel spaced-apart edges of any two adjacent boards is wide enough to allow mounting of said boards in a parallel, face-to-face, layered arrangement by folding said substrate at said gap;

vii) said gap being wide enough to allow for an air space between any opposite facing component attached to separate boards;

b) said second element comprising:

i) a rigid circuit board having a network of conductive traces and vias incorporated therein said board defined by spaced-apart first and second elongated edges;

ii) a comb of connecting terminals integral with said second element along said first elongated edge, said comb connected to said traces and vias to continue said data paths;

iii) said comb sized and dimensioned to engage a connecting port on a supporting structure; and, iv) a first plurality of feed-through holes engaging said data paths in said first element arranged for connection to a like second plurality of feed-through holes engaging said data paths formed in said second element; and, c) means for interconnecting said first and said second feed-through holes so that said data paths from each of said half-sections through to said support structure are of equal lengths, wherein said means for interconnecting said first and said second feed-through holes includes solder bumps.

* * * * *